United States Patent [19]

Byrne

[11] Patent Number: 5,136,364
[45] Date of Patent: Aug. 4, 1992

[54] SEMICONDUCTOR DIE SEALING

[75] Inventor: Robert C. Byrne, Sunnyvale, Calif.

[73] Assignee: National Semiconductor Corporation, Santa Clara, Calif.

[21] Appl. No.: 713,947

[22] Filed: Jun. 12, 1991

[51] Int. Cl.$^5$ .................... H01L 23/48; H01L 29/46; H01L 29/34

[52] U.S. Cl. ........................ 357/71; 357/54; 357/67

[58] Field of Search ............... 357/71, 67, 54, 49; 437/192, 194

[56] References Cited

U.S. PATENT DOCUMENTS

| | | | |
|---|---|---|---|
| 4,827,326 | 5/1989 | Altman et al. | 357/67 |
| 4,927,505 | 5/1990 | Sharma et al. | 357/71 |

FOREIGN PATENT DOCUMENTS

| | | | |
|---|---|---|---|
| 60-35525 | 2/1985 | Japan | 437/194 |
| 62-242333 | 10/1987 | Japan | 357/74 |
| 2-113533 | 4/1990 | Japan | 357/74 |

*Primary Examiner*—Rolf Hille
*Assistant Examiner*—Robert Limanek
*Attorney, Agent, or Firm*—Gail W. Woodward; Irving S. Rappaport; James W. Rose

[57] ABSTRACT

Integrated circuit bonding pads are sealed by a surface passivation coating. The bonding pads are first edge-sealed by means of a first applied passivation coating that overlaps the edges of the bonding pad while leaving the central area uncoated. Then, a sequence of metal layers applied to overlap the open central area of the bonding pad. The layer sequence includes an optional first adherence layer such as aluminum, a barrier metal layer such as titanium-tungsten alloy, and an outer noble metal layer such as gold. Then, a second passivation layer is applied so as to overlap and seal the edges of the sequence of metal layers so as to leave only the central portion of the noble metal layer exposed. Electrical contact to the IC is then made to the exposed noble metal in the conventional manner. With respect to the passivating coatings, either or both can be silicon dioxide overcoated with silicon nitride. Furthermore, the second passivating coating can include either low melting glass that is spun-on using a powdered-glass slurry or it can be an organic, such as a polyimide monomer, spun-on in liquid form.

8 Claims, 1 Drawing Sheet

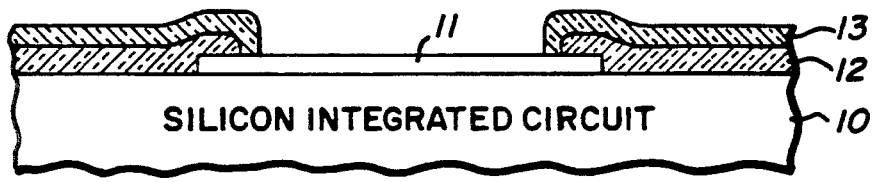
Fig_1 (PRIOR ART)
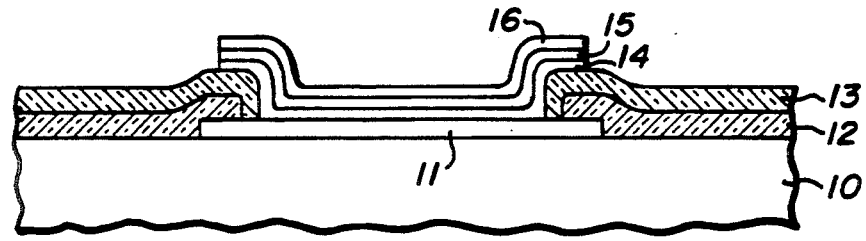
Fig_2
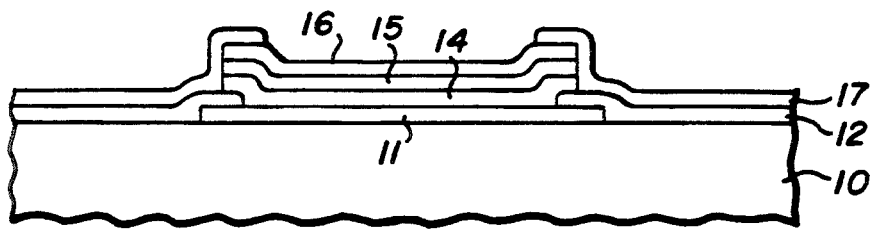
Fig_3
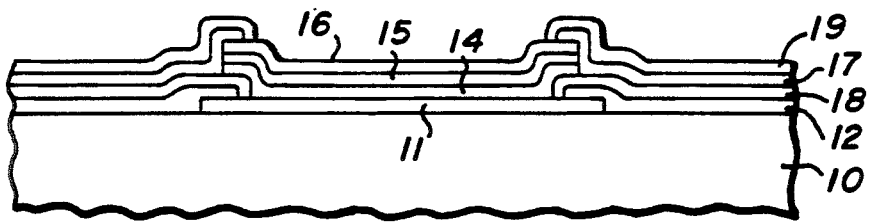
Fig_4
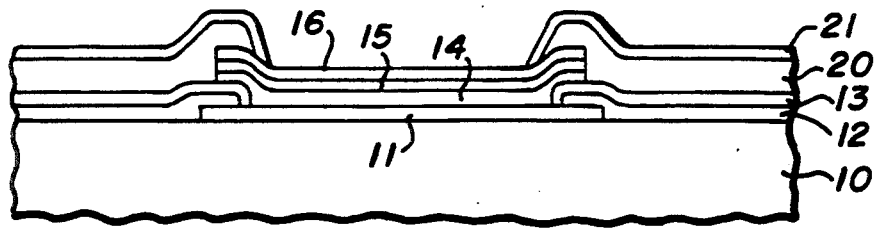
Fig_5

SEMICONDUCTOR DIE SEALING

BACKGROUND OF THE INVENTION

Semiconductor integrated circuit (IC) devices typically employ aluminum as the metal of choice for use with silicon substrates. Typically, an aluminum bonding pad is overlapped with the preferred passivation which is commonly a layer of silicon dioxide overcoated with silicon nitride ($Si_3N_4$). The central area of the aluminum bonding pad is left open for electrical connections which will be associated with the IC housing. Typically, bond wires, metal fingers or metal bumps are connected to the bond pads to provide the desired connection. If the metal involved is a noble metal such as gold, which is useful because of its corrosion resistance, it must be isolated from the aluminum by a barrier layer which can be composed of, for example, nickel-alloy, titanium-tungsten alloy, chromium or chromium alloy. Basically, the barrier layer should adhere well to the aluminum and whatever passivation layer is present and it should chemically isolate the aluminum metallization from the noble metal electrical connection.

Typically, in the prior art the aluminum bonding pads exposed inside the passivation layer are overcoated with a succession of metal layers such as aluminum (optional) for initial adherence, a barrier metal layer for isolation and a noble metal for electrical contact. These layers actually overlap the passivation coat so as to completely seal off the original aluminum bonding pad. However, the edges of the metal layers will be exposed to any contaminants that the packaged IC is exposed to. For example, in plastic molded housings the encapsulant is permeable to moisture to some degree. Furthermore, the plastic seal to the metal leads will typically admit moisture along the interface and into the IC, particularly after temperature cycling. Accordingly, it has become common to provide hermetic packaging for devices that require high reliability. While this is effective, it is costly and even hermetic packages have been known to develop leaks. As a result, it is deemed useful to provide a suitable seal for the IC itself wherein any contaminants will not be able to attack the IC components even when they are present inside the package.

SUMMARY OF THE INVENTION

It is an object of the invention to provide a seal for a semiconductor IC die which will exclude contaminants from the critical parts.

It is a further object of the invention to provide a metallization layer sequence for an IC die in which a passivation layer covers the edges of the metallization layers thereby rendering them immune to attack by contaminants.

These and other objects are achieved as follows. An IC bonding pad is provided with a passivation layer that overlaps the edges thereof so as to leave the central portion exposed. A sequence of metal layers comprise an optional layer of aluminum for adherence, a barrier metal layer to metallurgically isolate the aluminum and a noble metal contact layer. The edges of the metal layer sequence are overlapped by an upper passivation layer which, therefore, seals their edges and renders them immune to chemical contaminants. The upper passivation layer can include the well known silicon dioxide and nitride combination or silicon carbide and can further include layers of glass and/or polyimide or other organic coatings.

BRIEF DESCRIPTION OF THE DRAWING

FIG. 1 is a cross section of an IC chip fragment in the vicinity of a prior art bonding pad.

FIG. 2 shows a prior art bonding pad overcoated with a well known metal layer sequence.

FIG. 3 shows a simplified embodiment of the invention.

FIG. 4 shows an improved embodiment of the invention.

FIG. 5 shows another improved embodiment of the invention.

DESCRIPTION OF THE PRIOR ART

FIG. 1 which shows a prior art bonding pad, is a fragmentary cross section of a silicon wafer. The drawing is not to scale. The vertical dimensions have been exaggerated to show the layers involved, but not their scale. Substrate 10 is the silicon IC which includes an aluminum bonding pad 11. A two component passivation is shown. Layer 12 is a relatively thin coating of $SiO_2$, which is typically made to overlap the edges of bonding pad 11, as shown. A layer of silicon nitride 13 is applied on top of layer 12, to overlap it as shown. As a practical matter, layers 12 and 13 are applied over the entire IC wafer and holes are etched through them to expose the center portions of the bonding pad 11. The wraparound effect on layer 13 is created by first depositing layer 12 and etching the hole therein. Then layer 13 is applied and photolithographically etched to produce the structure shown.

FIG. 2 illustrates the next step in the prior art approach. Here, the substrate 10, with its bonding pad 11 and passivation layers 12 and 13, is provided with a three metal layer sequence. Layer 14, which is optional, is aluminum selected to provide good adherence to bonding pad 11 and passivation layer 13. Layer 15 is a barrier metal layer, such as a nickel-vanadium alloy a titanium-tungsten alloy, chromium or nickel-chromium alloy. This layer metallurgically isolates the aluminum from the noble metal. Layer 16 is a noble metal, such as gold or platinum, which will be corrosion resistant and provide an eternal IC connection.

The structure of FIG. 2 is useful, but it has a serious drawback. The aluminum and barrier layers 14 and 15, while covered by layer 16, are exposed at their edges to potential contaminants. For example, any moisture and ionic contaminants that could come into contact with the IC could act as a medium that will produce chemical or electrochemical attack and the layer sequence can be thereby undercut. Furthermore, such moisture will be drawn by capillary action along the metal layer interfaces to promote corrosion once it starts.

DESCRIPTION OF THE INVENTION

FIG. 3 shows the die sealing of the invention in its most elementary form. Substrate 10, bonding pad 11 and passivation layer 12, along with metal layer 14 through 16, are as was described for FIG. 2. An additional passivation 17, consisting for example of $SiO_2$, is applied so as to seal the edges of metal layers 14–16. As a practical matter, layer 17 can be deposited over the entire IC wafer and the inner portion of noble metal layer 16 exposed by conventional photolithographic etching using either a wet fluoride or plasma etch.

FIG. 4 shows an alternative structure embodiment. Here, a Si$_3$N$_4$ layer 18 is located between oxide layers 12 and 17. Additionally, if desired, another Si layer 19 can be applied as shown on top of oxide layer 17. This provides the excellent passivation of the combination of oxide and nitride. As before, it is proposed that the structure be created by applying layers 17 and 19 over the entire silicon wafer in fabrication and then photolithographically etching the hole in the center of the bonding pad to expose the surface of noble metal layer 16. The etching again can be either wet chemical or plasma driven. This embodiment represents the preferred embodiment of the invention.

FIG. 5 shows still another embodiment of the invention. Here layers 11 through 16 are as was described previously. However, layer 20 consists of a relatively thick glass layer created, desirably by a particle slurry spin-on technique well known in the art. Here, a low melting glass is ground to a fine powder and suspended in a suitable liquid to create a slurry. The slurry is then applied to a rapidly spinning wafer so that it forms a surface film. The coated wafer is then fired to melt the glass, drive off the liquid and coalesce the glass particles into a surface levelling layer. This is followed by the application of a Si$_3$N$_4$ layer 21 which completes the passivation. The surface of noble metal layer 16 is, as usual, exposed by photolithographic etching.

Alternatively, layer 20 can be composed of an organic polymer such as polyimide. This material can be spun on as a liquid monomer which is then cured in place to provide the desired coating. As a practical matter, if the spun-on coating is only partially cured, it can easily be etched to create the desired hole. Afterward, the cure can be completed to produce the tough, flexible polyimide passivation coating.

The invention has been described and a preferred embodiment detailed. Alternative embodiments have also been described. When a person skilled in the art reads the foregoing description, alternatives and equivalents, within the spirit and intent of the invention, will be apparent. Accordingly, it is intended that the scope of the invention be limited only by the claims that follow.

I claim:

1. A die sealing bonding pad structure for use as an integrated circuit bonding pad that includes a noble metal bonding face and sealed edges that are protected from adverse environments, said bonding pad structure comprising:

an aluminum bonding pad located on a semiconductor integrated circuit;

a first passivation layer overlapping the edges of said aluminum bonding pad whereby the central region is not covered by said first passivation layer;

a sequence of conductive layers overlying said aluminum bonding pad and having edges that overlap said first passivation layer, said sequence comprising at least a barrier metal layer and a noble metal outer layer, said barrier layer operating to metallurgically isolate said noble metal from said aluminum; and a second passivation layer overlapping the edges of said sequence of conductive layers whereby the central region of said noble metal outer layer is exposed for making electrical contact to said integrated circuit and said second passivation layer seals the edges of said sequence of conductive layers.

2. The die sealing bonding pad of claim 1 wherein said noble metal is selected from the group consisting of gold and platinum.

3. The die sealing bonding pad of claim 1 wherein said barrier metal is selected from the group consisting of titanium-tungsten alloys, nickel-vanadium alloys, chromium and chromium-nickel alloys.

4. The die sealing bonding pad of claim 1 wherein said sequence of conductors further includes an adhesion metal layer between said aluminum bonding pad and said barrier metal layer.

5. The die sealing bonding pad of claim 4 wherein said adhesion layer comprises aluminum.

6. The die sealing bonding pad of claim 1 wherein said first and second passivation layers comprise at least a first layer of silicon dioxide.

7. The die sealing bonding pad of claim 6 further comprising a layer of silicon nitride on top of said silicon dioxide.

8. The die sealing bonding pad of claim 6 wherein said second passivation layer comprises a relatively thick layer of either low melting glass or insulating organic material overcoated with silicon nitride.

* * * * *